United States Patent
Yoshimine et al.

(10) Patent No.: US 10,084,105 B2
(45) Date of Patent: Sep. 25, 2018

(54) SOLAR CELL MODULE AND SOLAR CELL MODULE MANUFACTURING METHOD

(71) Applicant: SANYO Electric Co., Ltd., Osaka (JP)

(72) Inventors: Yukihiro Yoshimine, Hyogo (JP); Tasuku Ishiguro, Osaka (JP); Naoto Imada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 717 days.

(21) Appl. No.: 14/484,443

(22) Filed: Sep. 12, 2014

(65) Prior Publication Data

US 2014/0373897 A1   Dec. 25, 2014

Related U.S. Application Data

(63) Continuation of application No. PCT/JP2012/057534, filed on Mar. 23, 2012.

(51) Int. Cl.
| | | |
|---|---|---|
| *H01L 31/042* | (2014.01) | |
| *H01L 31/00* | (2006.01) | |
| *H01L 31/05* | (2014.01) | |

(52) U.S. Cl.
CPC .......... *H01L 31/0508* (2013.01); *Y02E 10/50* (2013.01)

(58) Field of Classification Search
CPC .................................................. H01L 31/0508
See application file for complete search history.

(56) References Cited

U.S. PATENT DOCUMENTS

| | | |
|---|---|---|
| 6,184,457 B1 | 2/2001 | Tsuzuki et al. |
| 6,479,744 B1 | 11/2002 | Tsukuki et al. |
| 2011/0005568 A1* | 1/2011 | Kim ............... H01L 31/0236 136/244 |
| 2013/0125952 A1 | 5/2013 | Sumitomo |

FOREIGN PATENT DOCUMENTS

| | | |
|---|---|---|
| CN | 1221224 A | 6/1999 |
| JP | H11186572 A | 7/1999 |
| JP | 2005302902 A | 10/2005 |
| JP | 2006013406 A | 1/2006 |
| JP | 2006059991 A | 3/2006 |
| JP | 2012009681 A | 1/2012 |
| WO | 2005098969 A | 10/2005 |
| WO | 2011004950 A1 | 1/2011 |

OTHER PUBLICATIONS

Chinese Office Action corresponding to Application No. 201280071685.8; Dated: Aug. 3, 2016.
International Search Report for International Application No. PCT/JP2012/057534; Dated, Apr. 17, 2012; with English translation.
Japanese Notice of Grounds for Rejection corresponding to Patent Application No. 2014-505933; Dated: Jun. 7, 2016, with English translation.
Chinese Notification of the First Office Action corresponding to Application No. 201280071685.8; Dated: Dec. 29, 2015, with English translation.

* cited by examiner

*Primary Examiner* — Angelo Trivisonno
(74) *Attorney, Agent, or Firm* — Cantor Colburn LLP

(57) ABSTRACT

This solar cell module is provided with: a plurality of solar cells; and a tab, which electrically connects the solar cells, and which has recesses and projections on the surface thereof. The tab has height of the recesses and the projections smaller in the peripheral region of each of the solar cells, compared with that in other regions of each of the solar cells.

3 Claims, 7 Drawing Sheets

SOLAR CELL MODULE AND SOLAR CELL MODULE MANUFACTURING METHOD

CROSS-REFERENCE TO RELATED APPLICATIONS

The present application is a continuation under 35 U.S.C. §120 of PCT/JP2012/057534, filed Mar. 23, 2012, which is incorporated herein by reference.

TECHNICAL FIELD

The present invention relates to a solar cell module and a solar cell module manufacturing method.

BACKGROUND ART

In recent years, solar cells that are capable of converting sunlight to electric energy have been used as a petroleum-alternative energy source. Examples of the solar cell include a single crystal type solar cell, a polycrystalline type solar cell, an amorphous type solar cell or the like, or the combination thereof. Normally, the plurality of solar cells are connected in series or in parallel and used as a solar cell module.

A sectional view in FIG. 13 illustrates a configuration of a conventional solar cell module 100. The solar cell module 100 has a structure in which a plurality of solar cells 10 are connected by a tab 12. The tab 12 connects a first electrode 14 on a light receiving surface side of the solar cell 10 and a second electrode 16 on a back surface side of the adjacent solar cell 10. Here, the tab 12 has bent parts 12a in order to provide a level difference for a thickness of the solar cell 10.

Also, in order to effectively utilize light made incident on a surface of the tab 12 on the light receiving surface side of the solar cell 10, the tab 12 that is used has recesses and projections on the surface. With such a tab 12, the light made incident on the surface of the tab 12 is scattered by the recesses and the projections, reflected by a sealing material 18 (glass or the like) that seals the solar cell 10 further, and guided from an area not provided with the tab 12 to the solar cell 10. Thus, the light reflected on the surface of the tab 12 is also made to effectively contribute to power generation, and power generation efficiency of the solar cell module 100 is improved.

SUMMARY OF INVENTION

Technical Problem

Now, when using the solar cell module 100, as illustrated in FIG. 14, there is a risk that an edge part of the solar cell 10 and the tab 12 are brought into contact, stress (in the figure, an arrow direction) is applied, and the solar cell 10 gets broken. For instance, when a heat cycle is added to the solar cell module 100, an interval between the solar cells 10 becomes narrow and there is a risk that the edge part of the solar cell 10 and the tab 12 will be brought into contact.

In particular, when the recesses and projections are provided on the surface of the tab 12, the projected part and the solar cell 10 are brought into contact, and stress is intensively applied to the projected part. As a result, the risk of breakage of the solar cell 10 and degradation of characteristics becomes high.

Solution to Problem

One aspect of the present invention is a solar cell module that includes a plurality of solar cells and a tab which electrically connects the plurality of solar cells and has recesses and projections on a surface, and the recesses and projections of the tab are lower in height in a peripheral edge area of the solar cell than in another area.

Another aspect of the present invention is a solar cell module manufacturing method that includes a first step of lowering the height of the recesses and projections in a partial area of the tab having the recesses and projections on the surface, and a second step of electrically connecting the plurality of solar cells with the tab. In the second step, the area where the height of the recesses and projections is lowered is arranged in the peripheral edge area of the solar cell.

Advantageous Effects of Invention

According to the present invention, generation of cracks or the like of solar cells is suppressed in a solar cell module including the solar cells connected by a tab having recesses and projections on a surface, and reliability of the solar cell module is improved.

DESCRIPTION OF EMBODIMENTS

Configuration of Solar Cell Module

Figure 1:
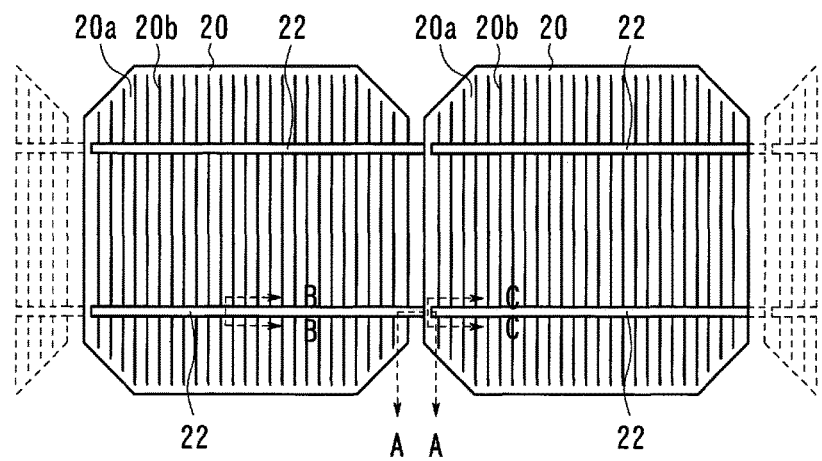
FIG. 1 is a plan view illustrating a configuration of a solar cell module in an embodiment of the present invention.
Figure 2:
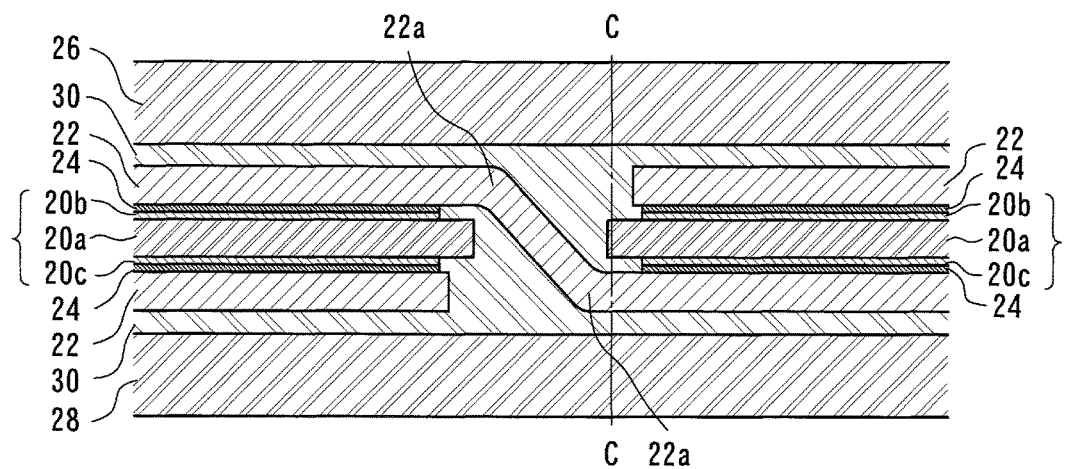
FIG. 2 is a sectional view illustrating the configuration of the solar cell module in the embodiment of the present invention.
Figure 3:
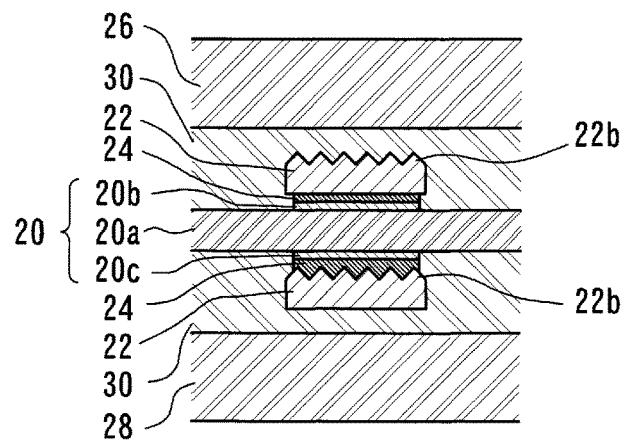
FIG. 3 is a sectional view illustrating the configuration of the solar cell module in the embodiment of the present invention.
Figure 4:
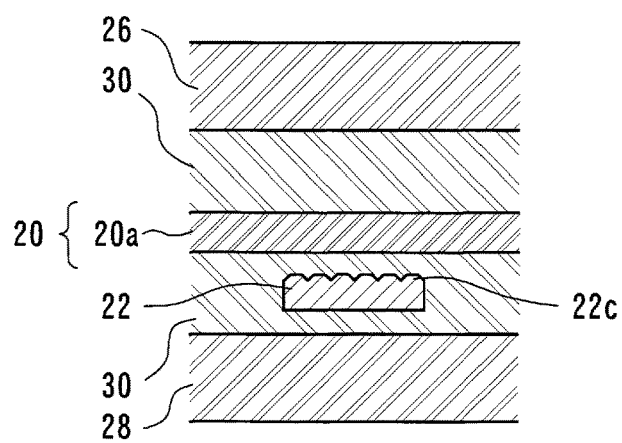
FIG. 4 is a sectional view illustrating the configuration of the solar cell module in the embodiment of the present invention.

As illustrated in the plan view of FIG. 1 and the sectional views of FIGS. 2 to 4, a solar cell module 200 in the embodiment of the present invention includes a solar cell 20, a tab 22, an adhesive 24, a first protective member 26, a second protective member 28, and a filler 30. FIG. 1 is a plan view of the solar cell module 200 in the view from a light receiving surface side. FIG. 2 is a sectional schematic diagram along a line A-A in FIG. 1. FIG. 3 is a sectional schematic diagram along a line B-B in FIG. 1. FIG. 4 is a sectional schematic diagram along a line C-C in FIG. 1.

In the following descriptions, a "light receiving surface" means a surface which is one of main surfaces of the solar cell 20 and on which light from the outside is mainly made incident. For instance, 50%-100% of the light to be made incident on the solar cell 20 is made incident from the light receiving surface side. A "back surface" means a surface which is one of the main surfaces of the solar cell 20, and is on the opposite side of the light receiving surface.

The solar cell 20 includes a photoelectric conversion unit 20*a* that generates a carrier (an electron and a hole) by receiving light such as sunlight, a first electrode 20*b* provided on the light receiving surface of the photoelectric conversion unit 20*a*, and a second electrode 20*c* provided on the back surface of the photoelectric conversion unit 20*a*. The first electrode 20*b* and the second electrode 20*c* include, as illustrated in FIG. 1, a finger provided in a comb shape so as to cross an extending direction of the tab 22 and a bus bar connecting the finger. The bus bar is provided so as to be covered with the tab 22. The finger and the bus bar are formed, for instance, by screen-printing conductive paste for which a conductive filler such as silver (Ag) is dispersed in a binder resin on a transparent conductive layer in a desired pattern. When the light is not made incident from the back surface side of the solar cell 20, a metal film such as a silver (Ag) thin film may be formed on substantially the entire surface of the back surface of the photoelectric conversion unit 20*a* to attain the second electrode 20*c*. In the solar cell 20, the carrier generated in the photoelectric conversion unit 20*a* is collected by the first electrode 20*b* and the second electrode 20*c*.

The photoelectric conversion unit 20*a* includes a substrate composed of a semiconductor material such as crystalline silicon, gallium arsenide (GaAs) or indium phosphide (InP), for instance. Though a structure of the photoelectric conversion unit 20*a* is not limited in particular, in the present embodiment, the description is given assuming that the structure has a heterojunction of an n-type single crystal silicon substrate and amorphous silicon. For the photoelectric conversion unit 20*a*, for instance, on the light receiving surface of the n-type single crystal silicon substrate, an i-type amorphous silicon layer, a p-type amorphous silicon layer doped with boron (B) or the like, and the transparent conductive layer composed of translucent conductive oxide such as indium oxide are laminated in that order. Also, on the back surface of the substrate, the i-type amorphous silicon layer, an n-type amorphous silicon layer doped with phosphorus (P) or the like, and the transparent conductive layer are laminated in that order.

The solar cells 20 that are adjacent to each other in the solar cell module 200 are connected by the tab 22. As the tab 22, for instance, metal foil of copper or the like in a ribbon shape is usable. The tab 22 connects the first electrode 20*b* of the solar cell 20 and the second electrode 20*c* of the adjacent solar cell 20. The tab 22 is bonded with the adhesive 24 to the bus bar of the first electrode 20*b* of one solar cell 20 and the bus bar of the second electrode 20*c* of the other solar cell 20, for instance. The adhesive 24 may be, for instance, conductive adhesive paste (SCP) or a conductive adhesive film (SCF) for which conductive particles are dispersed in a thermosetting type adhesive containing an adhesive resin material such as an epoxy resin, an acrylic resin or a urethane resin. Also, for instance, an anisotropic conductive adhesive (ACF) which is lowly conductive in an in-plane direction of the solar cell 20 and is highly conductive in a film thickness direction may be used. Also, the first electrode 20*b* and the second electrode 20*c* may be connected to the tab 22 by a solder material without using the adhesive 24.

The tab 22 includes bent parts 22*a* in order to provide a level difference for a thickness of the solar cell 20. That is, the bent parts 22*a* are provided to form a structural clearance for the thickness of the solar cell 20 in order to connect the first electrode 20*b* and the second electrode 20*c* so that the solar cells 20 that are adjacent to each other are arranged within the same plane.

Also, as illustrated in FIG. 3, recesses and projections 22*b* are provided on the surface of the tab 22. For the recesses and projections 22*b*, a height between a recessed part and a projected part is preferably 1 μm or greater and 80 μm or smaller. In the present embodiment, the recesses and projections 22*b* are in a triangular groove shape along a length direction (extending direction) of the tab 22, but are not limited to the triangular groove shape, and may be in a conical shape, a quadrangular pyramid shape, a polygonal pyramid shape and a combination thereof or the like.

The recesses and projections 22*b* are capable of scattering the light when the light made incident from the light receiving surface side of the solar cell module 200 is made incident onto the surface of the tab 22, reflecting it further using the first protective member 26, and guiding it from the area not provided with the tab 12 to the solar cell 10. Thus, the light reflected on the surface of the tab 22 is also made to effectively contribute to power generation, and power generation efficiency of the solar cell module 200 is improved.

The first protective member 26 is a member provided in order to protect the light receiving surface side of the solar cell 20. Since the first protective member 26 is provided on the light receiving surface side of the solar cell 20, it is constituted of a transparent member which transmits the light of a wavelength band to be utilized in photoelectric conversion in the solar cell 20. As the first protective member 26, for instance, a translucent member such as a glass plate, a resin plate or a resin film can be used. The second protective member 28 is a member provided in order to protect the back surface side of the solar cell 20. As the second protective member 28, similarly to the first protective member 26, the glass plate, the resin plate or the resin film or the like can be used. When the light is not made incident from the back surface side of the solar cell 20, the second protective member 28 may be an opaque plate body or film. In this case, as the second protective member 28, for instance, a laminate film such as a resin film having aluminum foil or the like inside may be used. The first protective member 26 and the second protective member 28 are bonded with the first electrode 20*b* and the second electrode 20*c* of the solar cell 20 respectively using the filler 30.

In the solar cell module 200 in the present embodiment, as illustrated in FIG. 3 and FIG. 4, the height of the recesses and projections 22*c* of the tab 22 in the peripheral edge area of the solar cell 20 is made lower than the height of the recesses and projections 22*b* of the tab 22 in the other area.

Here, the peripheral edge area of the solar cell 20 is an area with a possibility of being in direct contact with the tab 22 near an edge of the solar cell 20. Also, the other area is at least a partial area other than the peripheral edge area of the solar cell 20. The other area may be, for instance, an area near the center of the solar cell 20.

Here, the bent parts 22a of the tab 22 are preferably provided with the recesses and projections 22c whose height is lower than the height of the recesses and projections 22b provided in the other area. The recesses and projections 22c may be provided on only one of the bent parts 22a.

When the recesses and projections are provided on only one surface of the tab 22, the recesses and projections 22c are preferably provided on the bend part 22a whose surface provided with the recesses and projections faces the solar cell 20 (in FIG. 2, the bend part 22a near the back surface side of the solar cell 20). Also, the recesses and projections 22c may be provided over the area connecting the plurality of solar cells 20, that is the area between the bent parts 22a. Also, the recesses and projections 22c may be formed so as to be on the inner side from a peripheral edge part of the solar cell 20.

Figure 5:
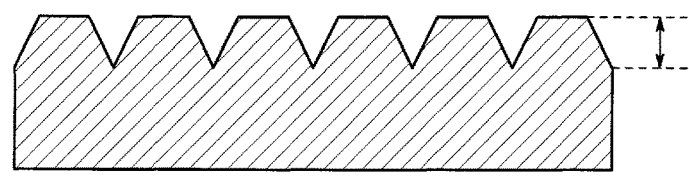
FIG. 5 is a diagram illustrating a height of recesses and projections of a tab in the embodiment of the present invention.

The height of the recesses and projections means, as illustrated in FIG. 5, an interval h from a recessed part (a valley part) to a projected part (mountain part) of the recesses and projections. When the height of the recesses and projections is not uniform, the height of the recesses and projections is defined as an average value of the recesses and projections along a width direction (a direction orthogonal to the extending direction) of the tab 22.

Figure 6:
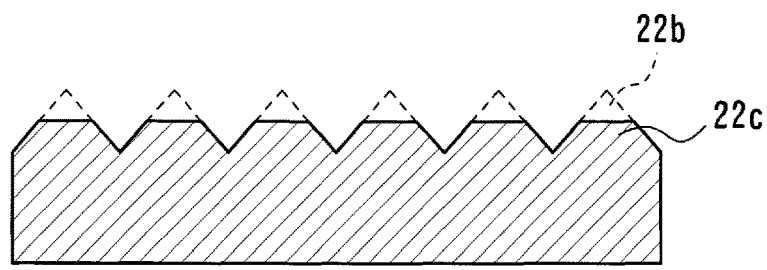
FIG. 6 is a sectional view illustrating an example of a shape of the recesses and projections of the tab in the embodiment of the present invention.
Figure 7:
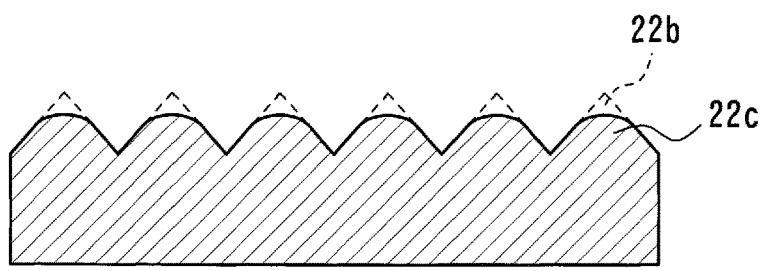
FIG. 7 is a sectional view illustrating an example of a shape of the recesses and projections of the tab in the embodiment of the present invention.

A cross-sectional shape of the recesses and projections 22c of the tab 22 may be such a shape that the height is lower than the height of the recesses and projections 22b of the tab 22 in the other area. For instance, as illustrated in FIG. 6, the cross-sectional shape of the recesses and projections 22c may be a shape having distal ends of the projected parts crushed to be flat. Also, as illustrated in FIG. 7, the cross-sectional shape of the recesses and projections 22c may be a shape having a curved surface for which a curvature of the distal end of the projected part is larger than the curvature of the distal end of the recesses and projections 22b in the other area. Of course, it may be a flat shape without providing the recesses and projections 22c. In FIG. 6 and FIG. 7, an example of a shape of the recesses and projections 22b is illustrated by a broken line so as to be easily compared with the recesses and projections 22c.

Figure 8:
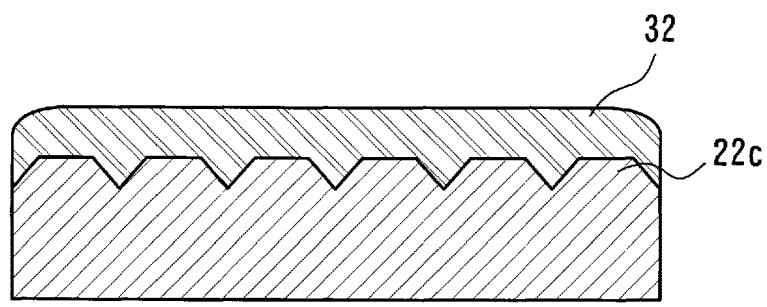
FIG. 8 is a sectional view illustrating an example in which a buffer material is provided on the recesses and projections of the tab in the embodiment of the present invention.

Also, as illustrated in FIG. 8, the area provided with the recesses and projections 22c of the tab 22 may be covered with a buffer material 32. The buffer material 32 is preferably a resin material such as an epoxy resin, an acrylic resin, or a urethane resin. For instance, excess adhesive 24 (the conductive adhesive paste (SCP) or conductive adhesive film (SCF)) used to bond the first electrode 20b and the second electrode 20c to the tab 22 as the buffer material 32. It is preferably the anisotropic conductive adhesive (ACF) which is lowly conductive in the in-plane direction of the solar cell 20 and is highly conductive in the film thickness direction.

In this way, by providing the tab 22 with the recesses and projections 22c that are smaller than the recesses and projections 22b in the other area in the peripheral edge area of the solar cell 20, contact of the tab 22 with the peripheral edge area (edge part) of the solar cell 20 is suppressed. Also, even if the tab 22 is brought into contact with the peripheral edge area (edge part) of the solar cell 20, concentration of a pressure applied from the projected part to the solar cell 20 is mitigated, and breakage of the solar cell 20 is suppressed.

Here, since the bend part 22a of the tab 22 is an area to be easily brought into contact with the solar cell 20 in a peripheral area of the solar cell 20, an effect of suppressing the breakage of the solar cell 20 by providing the bend part 22a with the recesses and projections 22c that are smaller than the recesses and projections 22b in the other area is significant. Also, by providing the recesses and projections 22c over the bent parts 22a, the breakage of the solar cell 20 is more surely suppressed.

Also, by covering the recesses and projections 22c of the tab 22 with the buffer material 32, the concentration of the pressure applied from the projected part to the solar cell 20 is mitigated by the buffer material 32, and the effect of suppressing the breakage of the solar cell 20 becomes more significant.

Formation Method of Tab

A formation method of the recesses and projections 22c of the tab 22 will be described below. It is assumed that the tab 22 is provided beforehand with the recesses and projections over the whole of one of the surfaces thereof. The recesses and projections can be formed, for instance, by mechanical press working. Then, the recesses and projections in a partial area of the tab 22 are worked to form the recesses and projections 22c that are smaller than the recesses and projections 22b in the other area.

Figure 9:
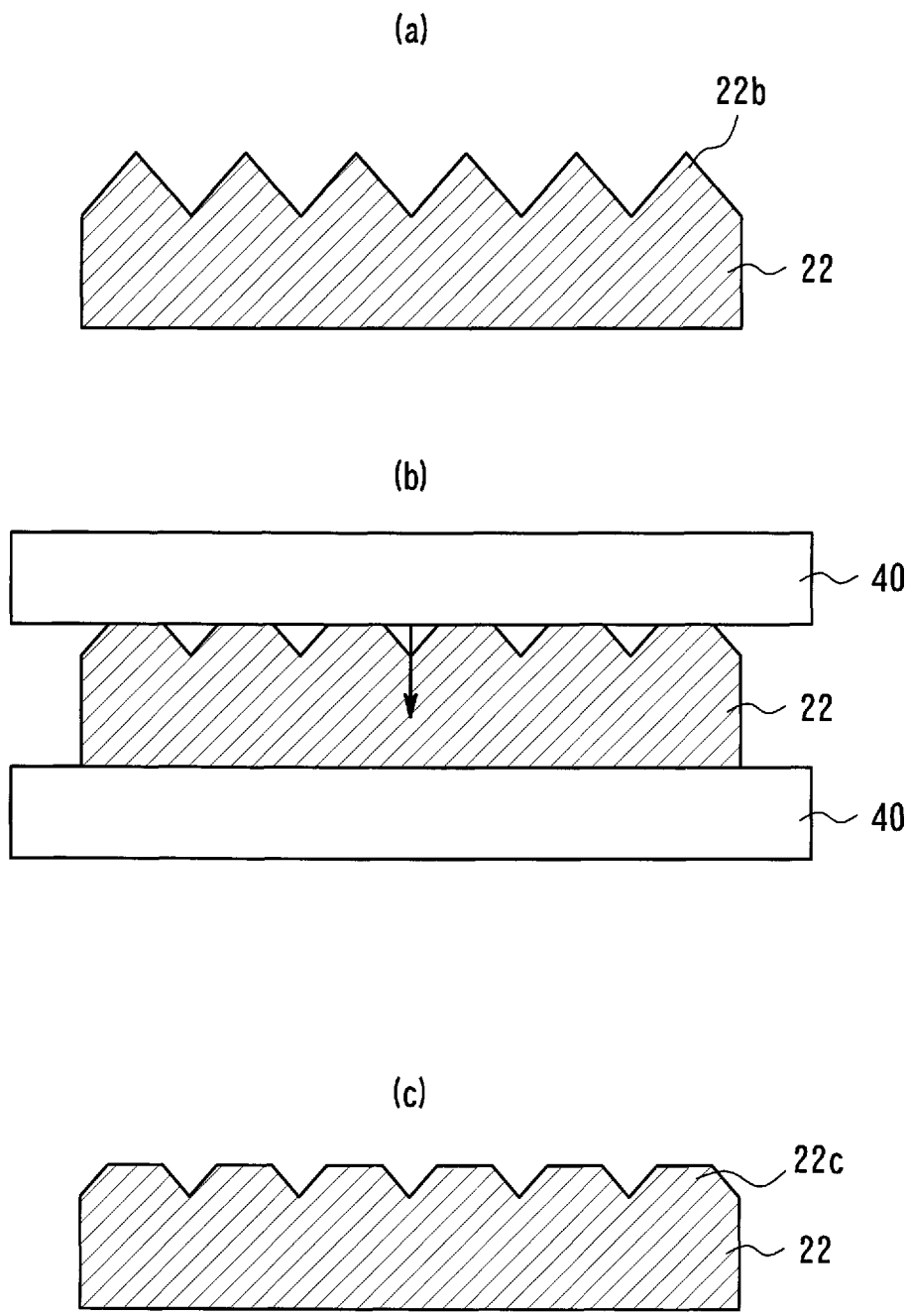
FIG. 9 is a diagram illustrating a formation method of the tab in the embodiment of the present invention.

For instance, as illustrated in FIG. 9(a) to FIG. 9(c), the recesses and projections 22c can be formed by press working. First, the tab 22 having the recesses and projections 22b all over is prepared (FIG. 9(a)). Then, distal ends of the projected parts of the recesses and projections 22b in the partial area of the tab 22 are mechanically pressed by a press working machine 40 (FIG. 9(b)). Thus, the recesses and projections 22c can be formed in the partial area of the tab 22 (FIG. 9(c)). In this case, the shape of the distal end of the projected part can be appropriately selected by a mold (metal mold) used in press working.

Figure 10:
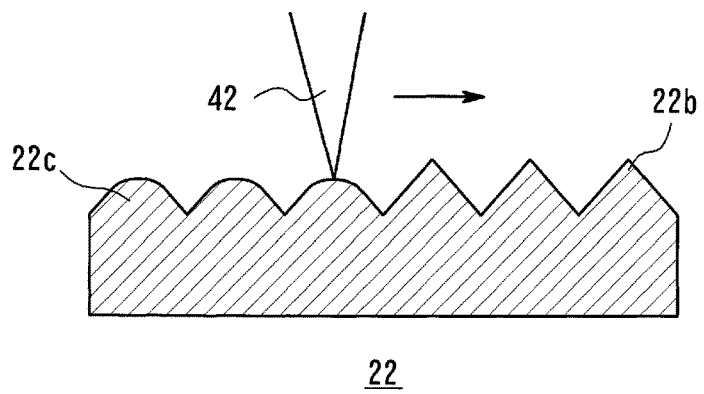
FIG. 10 is a diagram illustrating a formation method of the tab in the embodiment of the present invention.

Also, as illustrated in FIG. 10, the recesses and projections 22c can be formed by heating and fusing the distal ends of the projected parts. The heating method is not limited, and for instance, heating can be performed by radiating a laser beam 42 using a laser irradiation device.

Figure 11:
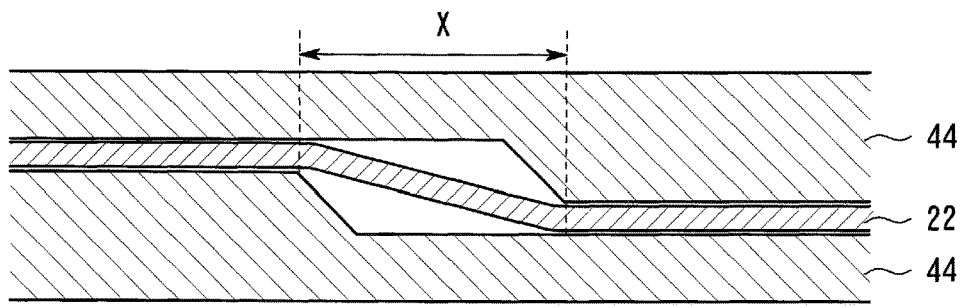
FIG. 11 is a diagram illustrating a formation method of the tab in the embodiment of the present invention.
Figure 11:
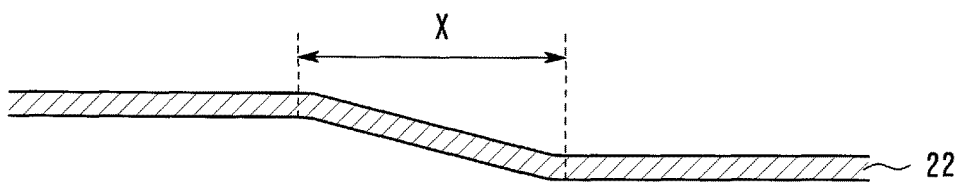

Next, the bent parts 22a are formed on the tab 22. The bent parts 22a can be formed by pressing pertinent parts of the tab 22 as illustrated in FIG. 11. The tab 22 having the recesses and projections 22c whose height is lower than the recesses and projections in the other area in the partial area is prepared (FIG. 11(a)). Then, the tab 22 is pressed by a press working machine 44 to form the bent parts 22a (FIG. 11(b)). The bent parts 22a are formed so that an area X where the recesses and projections 22c are formed is positioned in the peripheral edge area of the solar cell 20. For instance, the area X where the recesses and projections 22c are formed is preferably formed over the bent parts 22a. In this way, the bent parts 22a are formed on the tab 22 (FIG. 11(c)).

Of course, when the area X where the recesses and projections 22c are formed is positioned in the peripheral edge area of the solar cell 20, the formation method is not limited to the above. For instance, the recesses and projections 22c may be formed only in the areas corresponding to the bent parts 22a, and press working may be carried out so that the bent parts 22a are there. In the case of the present embodiment, the recesses and projections 22c are formed at two parts corresponding to the bent parts 22a. Also, in the case where the recesses and projections are provided only on one surface of the tab 22, the recesses and projections 22c may be formed only in the areas corresponding to the bent parts 22a where the surface provided with the recesses and projections faces the solar cell 20, and press working may be carried out so that the bent parts 22a are formed at the recesses and projections 22c. Also, the recesses and projections 22c may be formed so as to be on the inner side from the peripheral edge part of the solar cell 20.

In the case of covering the recesses and projections 22c of the tab 22 with the buffer material 32, after the recesses and projections 22c are formed, the buffer material 32 may be formed by coating or the like in the area where the recesses and projections 22c are formed.

Solar Cell Module Manufacturing Method

Hereinafter, a manufacturing method of the solar cell module 200 will be described. In the solar cell module 200, since the solar cell 20 can be formed by applying a conventional manufacturing method, a wiring method using the tab 22 which is a characteristic part will be described.

Figure 12:
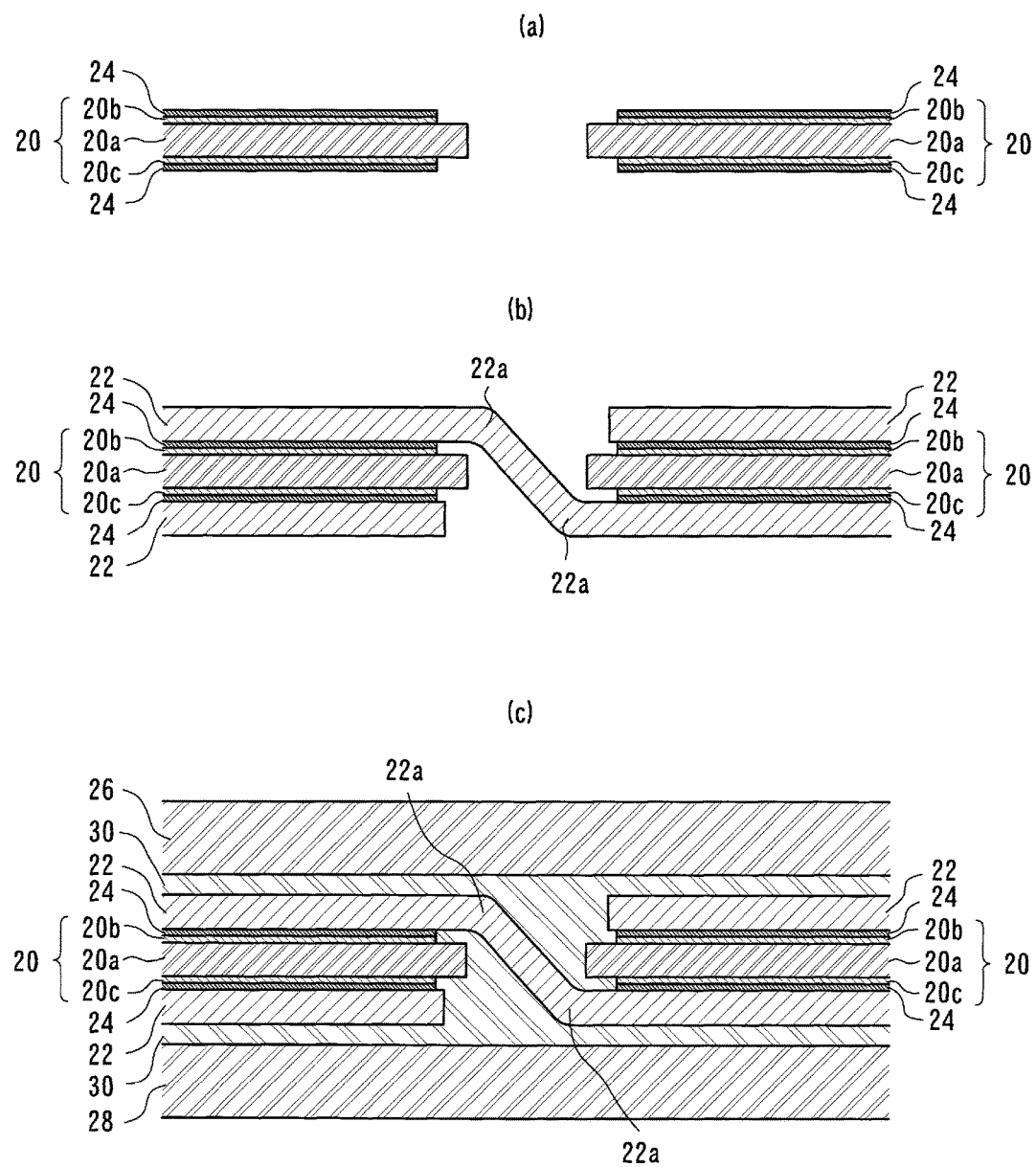
FIG. 12 is a diagram illustrating a manufacturing method of the solar cell module in the embodiment of the present invention.
Figure 13:
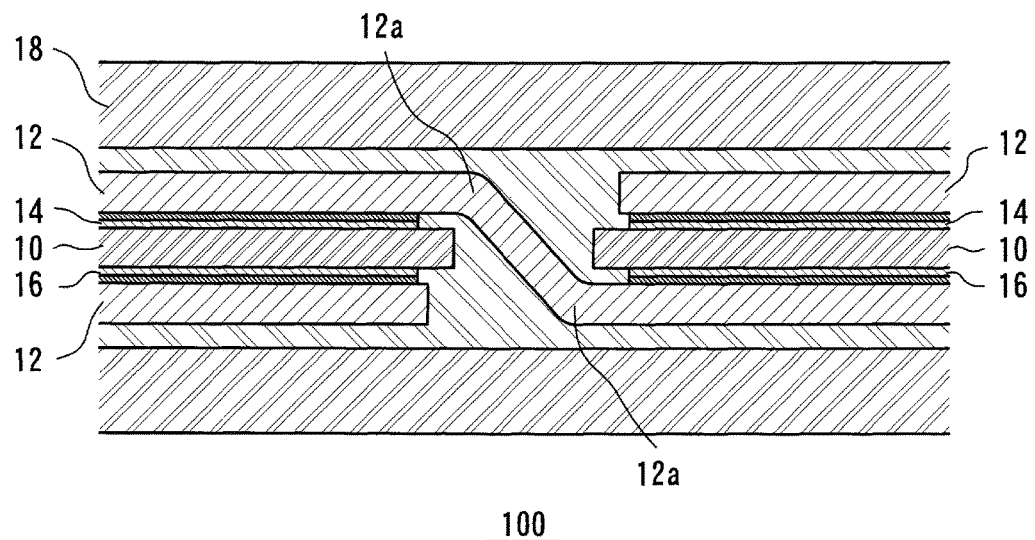
FIG. 13 is a sectional view illustrating a configuration of a conventional solar cell module.
Figure 14:
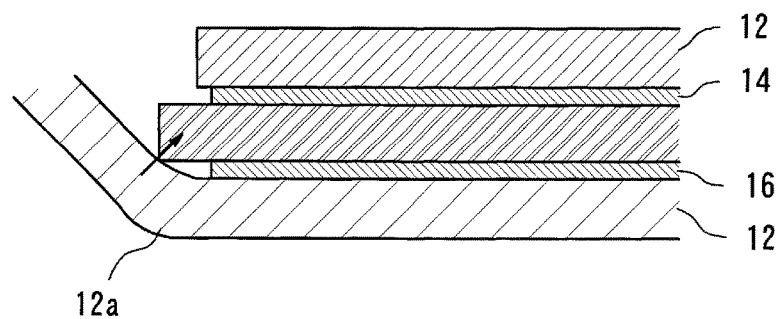
FIG. 14 is a diagram illustrating a problem of the conventional solar cell module.

As illustrated in FIG. 12(a), after the first electrode 20b and the second electrode 20c are formed on the solar cell 20, the adhesive 24 is arranged on the bus bars of the first electrode 20b and the second electrode 20c. Thereafter, as illustrated in FIG. 12(b), the tab 22 is bonded to the first electrode 20b and the second electrode 20c, and the solar cells 20 that are adjacent to each other are connected. Bonding is carried out so that the area of the tab 22 where the recesses and projections 22c are formed is positioned in the peripheral edge area of the solar cell 20. Then, as illustrated in FIG. 12(c), sealing is carried out using the first protective member 26, the second protective member 28, and the filler 30.

As described above, according to the solar cell module 200 of the present embodiment, the generation of cracks or the like of the solar cell 20 is suppressed, and reliability of the solar cell module 200 is improved.

The invention claimed is:

1. A solar cell module comprising:
a plurality of solar cells comprising a first solar cell and a second solar cell arranged in a longitudinal direction, each of the plurality of solar cells having a front light receiving surface and a rear surface opposite the front surface;
a tab that electrically connects the front surface of the first solar cell with the rear surface of the second solar cell, wherein the tab includes a bent part located between the first solar cell and the second solar cell;
wherein, when viewed along the longitudinal direction of the tab, the tab has a recess-projection shaped cross section in a width direction perpendicular to the longitudinal direction, and the recess valley and the projection peak of the recess-projection shape are formed along the longitudinal direction of the tab;
wherein the average height of the tab in a peripheral edge area of at least one of the first solar cell and the second solar cell is less than the average height of the tab in overlapping areas where the tab overlaps at least one of the first solar cell and the second solar cell;
wherein the average heights of the tab in the peripheral edge area and the overlapping areas are greater than zero;
wherein the average height is measured from recess valley to projection peak in the width direction of the respective cross section portion of the tab.

2. The solar cell module according to claim 1, wherein the tab comprises a front surface and a rear surface, and the tab's front surface forms the recess-projection shape and the tab's rear surface is flat.

3. The solar cell module according to claim 1, wherein a shape of the projection peak of the recess-projection shape of the tab in the peripheral edge area is different than a shape of the projection peak of the recess-projection shape of the tab in the overlapping areas.

* * * * *